United States Patent [19]
Van Buskirk et al.

[11] Patent Number: 5,263,000
[45] Date of Patent: Nov. 16, 1993

[54] DRAIN POWER SUPPLY

[75] Inventors: Michael A. Van Buskirk, San Jose; Johnny C. Chen, Cupertino; Chung K. Chang, Sunnyvale; Lee E. Cleveland, Santa Clara, all of Calif.; Antonio Montalvo, Raleigh, N.C.

[73] Assignee: Advanced Micro Devices, Inc., Sunnyvale, Calif.

[21] Appl. No.: 964,697

[22] Filed: Oct. 22, 1992

[51] Int. Cl.[5] ............................................. G11C 13/00
[52] U.S. Cl. .................................... 365/226; 365/227; 365/900
[58] Field of Search ........... 365/226, 227, 185, 189.01, 365/900, 218

[56] References Cited
U.S. PATENT DOCUMENTS 5,168,466  12/1992  Kuo et al. ........................... 365/900

Primary Examiner—Terrell W. Fears
Attorney, Agent, or Firm—Davis Chin

[57] ABSTRACT

A drain power supply for generating and supplying a regulated positive potential to drain regions of selected memory cells via bit lines in an array of flash EEPROM memory cells during programming includes charge pump means (20) formed of a plurality of charge pump sections (20a–20h) driven by one of a plurality of staggered clock signals for generating a moderately high level positive voltage. Cancellation means (26, 28) are coupled to each of the plurality of charge pump sections for effectively canceling out threshold voltage drops in the charge pump circuit. A regulator circuit (22) responsive to the regulated positive potential at an output node and a reference voltage is provided for generating a control voltage so as to control the high level positive voltage on the output node.

19 Claims, 7 Drawing Sheets

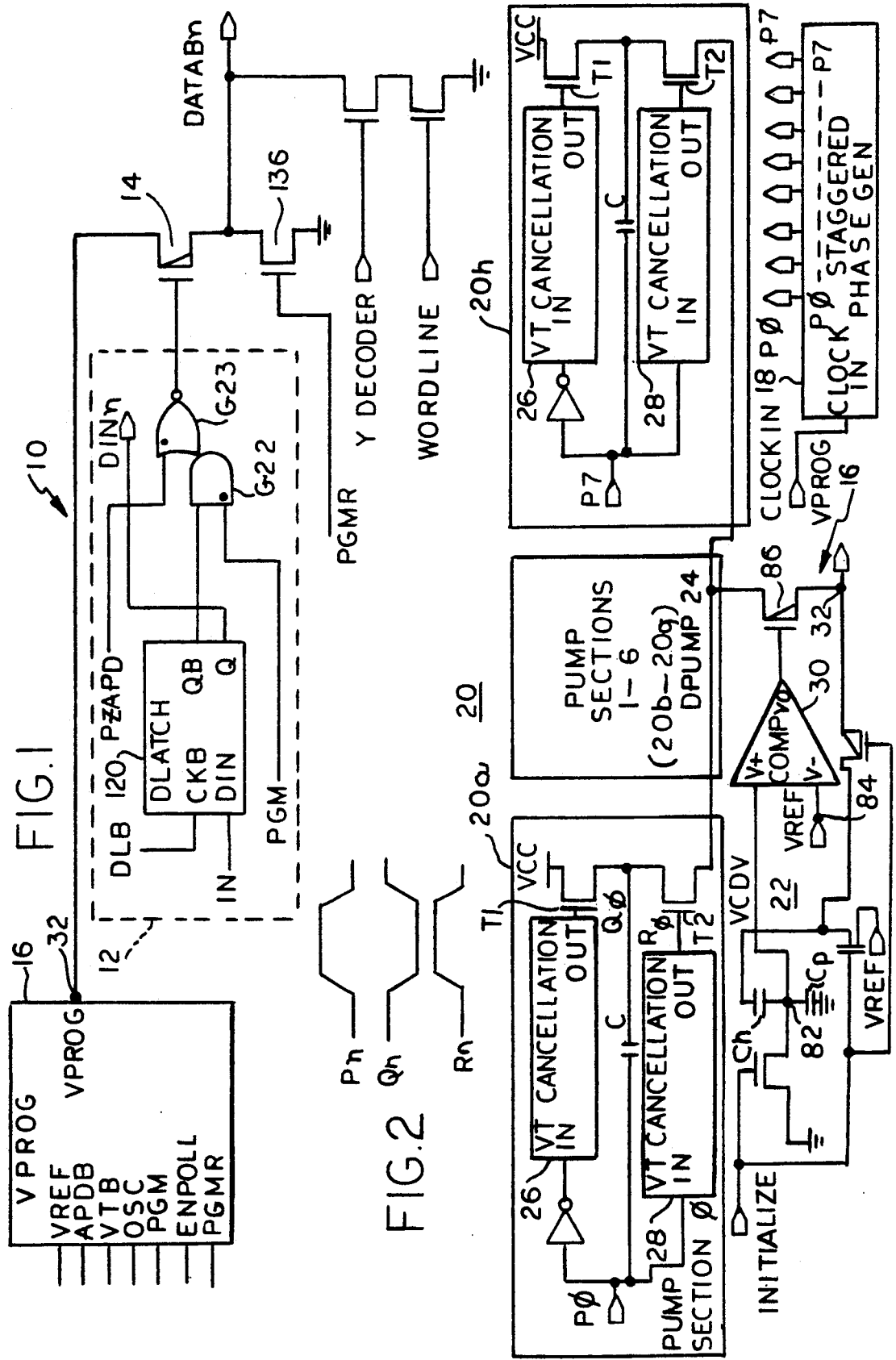

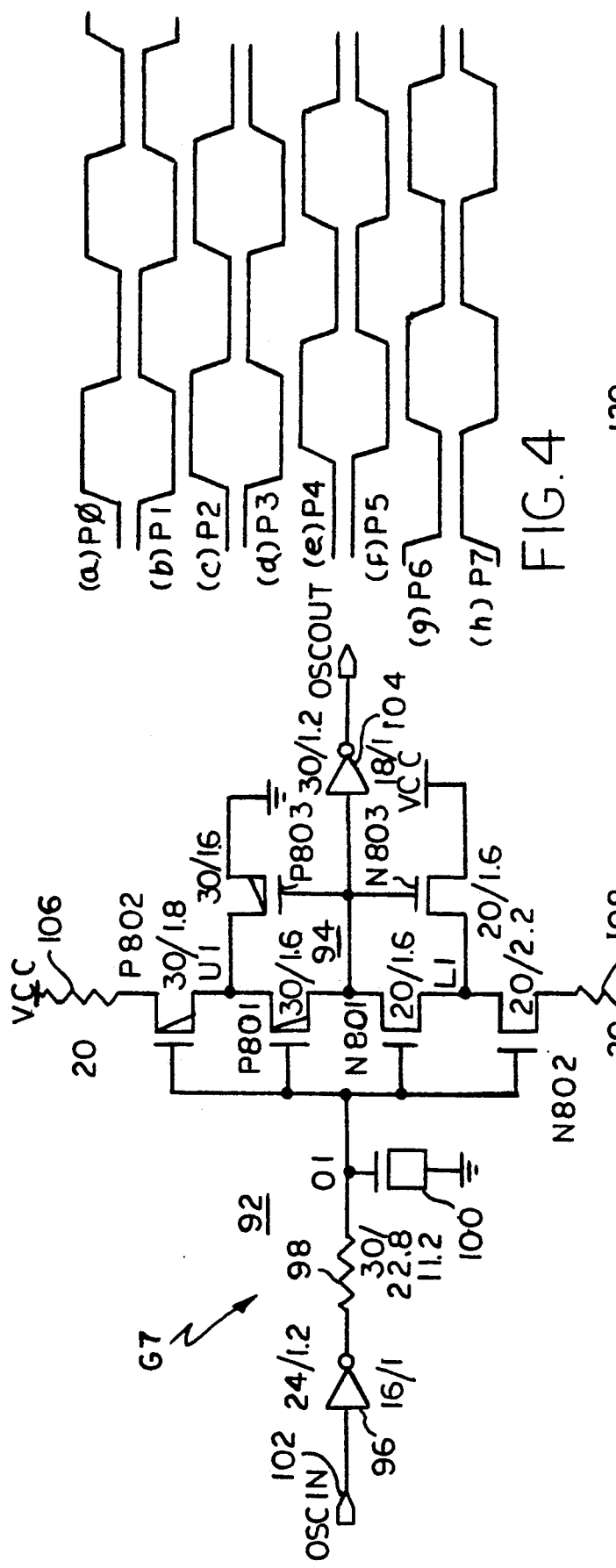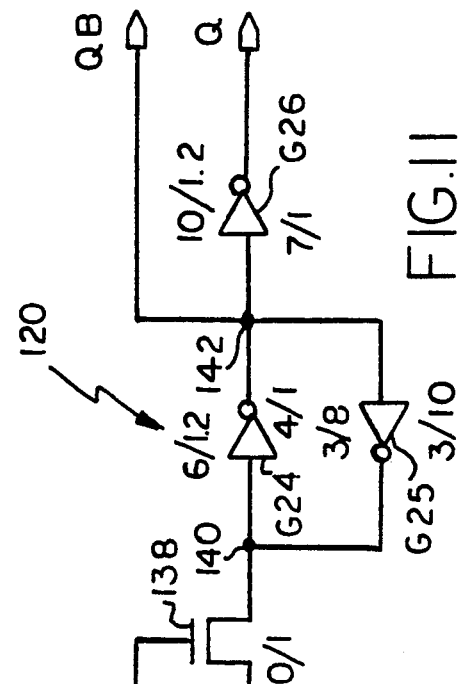

DRAIN POWER SUPPLY

BACKGROUND OF THE INVENTION

1. Field of the Invention

This invention relates generally to floating gate memory devices such as an array of flash electrically erasable programmable read-only memory (EEPROM) cells. More particularly, the present invention relates to an improved drain power supply for generating and supplying a regulated positive potential to drain regions of selected memory cells via bit lines in an array of flash EEPROM memory cells during programming.

2. Description of the Prior Art

In U.S. Pat. No. 5,077,691 to Sameer S. Haddad et al. issued on Dec. 31, 1991, there is disclosed a flash EEPROM array which includes a positive drain voltage charge pump 201. The '691 patent is assigned to the same assignee as in the present invention and is hereby incorporated by reference. During a sector-programming mode of operation, the charge pump 201 of FIG. 2B of the '691 patent generates a high level positive potential (i.e., +6 V) which is applied to the drain regions via the bit lines of the selected sectors while the drain regions of the memory cells in the non-selected sectors are floating. Further, the control gates of all transistors in the selected sectors are raised into a relatively high positive voltage of approximately +12 volts, and the source regions thereof are pulled to a ground potential of zero volts. In FIG. 5C of the '691 patent, there is shown a schematic of a charge pump circuit having a single positive voltage charge pump stage 502 for generating +6 volts. The charge pump circuit of FIG. 5C is used for the charge pump block 201 shown in FIG. 2B of the '691 patent.

In U.S. Pat. No. 5,126,808 to Antonio J. Montalvo et al. issued on Jun. 30, 1992, there is disclosed a flash EEPROM array with paged erase architecture which also includes a positive drain voltage charge pump. The '808 patent is also assigned to the same assignee as in the present invention and is hereby incorporated by reference. In FIG. 7F of the '808 patent, there is shown a schematic of a charge pump circuit 576 formed of a single positive voltage charge pump stage 570, similar to FIG. 5C of the '691 patent, for generating the high level positive potential of approximately +6 volts.

The present invention represents a significant improvement over the charge pump circuits shown in the respective '691 and '808 patents discussed above. The drain power supply of the present invention is used for generating and supplying a regulated positive potential to drain regions of selected memory cells via bit lines in an array of flash EEPROM memory cells during programming. The present drain power supply has been designed to supply approximately 6 mA and can be regulated between +6.5 V and +6.9 V over the military temperature and power supply ranges.

The drain power supply includes a positive charge pump circuit formed of a plurality of charge pump sections each being driven by one of a plurality of staggered clock signals for generating a moderately high level positive voltage. A cancellation circuit is coupled to each of the plurality of charge pump sections for effectively canceling out threshold voltage drops in the charge pump circuit. The drain power supply further includes a regulation circuit which is responsive to the regulated positive potential at an output node and a reference voltage for generating a control voltage which is varied increasingly so as to reduce the high level positive voltage to the output node and which is varied decreasingly so as to increase the high level positive voltage to the output node. The drain power supply of the present invention has increased pump efficiency, reduction of VCC and VSS noise, ripple reduction, and lower power dissipation than those power supplies traditionally available.

SUMMARY OF THE INVENTION

Accordingly, it is a general object of the present invention to provide an improved drain power supply for generating and supplying a regulated positive potential to drain regions of selected memory cells via bit lines in an array of flash EEPROM memory cells during programming, but yet overcomes the disadvantages of the prior art power supplies.

It is an object of the present invention to provide an improved drain power supply for generating and supplying a regulated positive potential which has increased efficiency, less ripple, reduced VCC and VSS noise, and lower power dissipation than those power supplies traditionally available.

It is another object of the present invention to provide an improved drain power supply for generating and supplying a regulated positive potential which includes a positive charge pump circuit formed of a plurality of charge pump sections each being driven by one of a plurality of staggered clock signals for generating a moderately high level positive voltage and a cancellation circuit for effectively canceling out threshold voltage drops in the charge pump circuit.

It is still another object of the present invention to provide an improved drain power supply for generating and supplying a regulated positive potential which includes a positive regulator circuit for generating a control voltage which is varied increasingly or decreasingly so as to adjust the high level positive voltage.

In accordance with these aims and objectives, the present invention is concerned with the provision of a drain power supply for generating and supplying a regulated positive potential to drain regions of selected memory cells via bit lines in an array of flash EEPROM memory cells during programming. The drain power supply includes a clock circuit for generating a plurality of staggered clock signals and a charge pump circuit responsive to an external power supply potential VCC and to the plurality of staggered clock signals for generating a moderately high level positive voltage. The charge pump circuit is formed of a plurality of charge pump sections. Each of the plurality of charge pump sections has its input connected to receive a respective one of the plurality of staggered clock signals and has its output connected to a pumped up node.

A cancellation circuit is coupled to each of the plurality of charge pump sections for effectively canceling out threshold voltage drops in each of the plurality of charge pump sections. A positive regulator circuit is responsive to the regulated positive potential at an output node and a reference voltage for generating a control voltage which is varied increasingly so as to reduce the high level positive voltage to the output node and which is varied increasingly so as to increase the high level positive voltage to the output node.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a general overall block diagram of a drain power supply, constructed in accordance with the principles of the present invention;

FIG. 2 is a block diagram of the drain voltage generation and regulation circuits of FIG. 1;

FIG. 4 is a timing diagram of the staggered phases of the clock signals generated by the clock generator circuit of FIG. 3;

FIG. 8 is a schematic diagram of one of the delay elements of FIG. 3;

FIG. 11 is a schematic diagram of the D-latch circuit of FIG. 10.

DESCRIPTION OF THE PREFERRED EMBODIMENT

Figure 3:
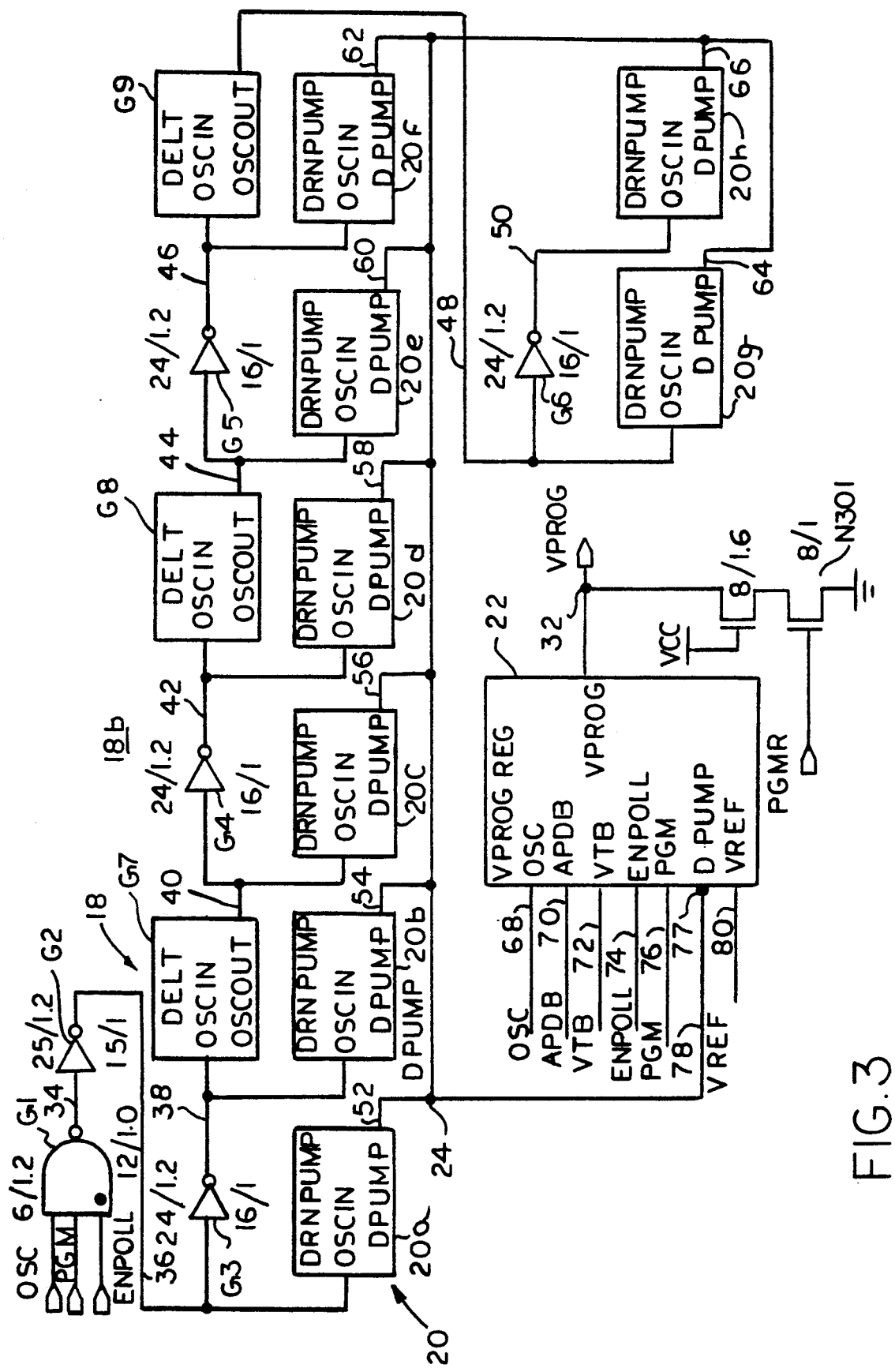
FIG. 3 is a more detailed schematic diagram of the drain voltage generation and regulation circuits of FIG. 1.

Referring now in detail to the drawings, there is shown in FIG. 1 a general overall simplified block diagram of a drain power supply 10 for generating and supplying a regulated positive potential to drain regions of selected memory cell transistors through the bit lines during the programming mode of operation, which is constructed in accordance with the principles of the present invention. The drain power supply 10 is formed as a part of a single integrated circuit chip (not shown) which contains an array having a large number of flash EEPROM memory cells arranged in an N×M matrix. An external or off-chip power supply potential VCC (also not shown), which is typically at +5.0 V, is supplied to the integrated circuit chip and is fed to the input of the drain power supply 10.

The array of the flash EEPROM memory cells is formed on a substrate to define columns and rows, where the substrate includes a common source line extending along at least one of the rows and a plurality of bit lines extending along respective columns. Each of the memory cells includes an N-type source region coupled to the common source line, a control gate, a floating gate, a channel region and an N-type drain region coupled to a respective one of the bit lines. Further, each of the memory cells is programmable predominately by transferring hot electrons into its floating gate and is erasable predominately by tunneling electrons from its floating gate to its source region.

The drain power supply 10 generates the regulated positive potential VPROG which is coupled to the data bit lines DATABn via a data input buffer circuit 12 and a P-channel pull-up transistor 14. The data input buffer circuit 12 operates to supply the regulated positive potential VPROG to the drain regions of the selected memory cell transistors through the bit lines during programming. The buffer circuit also causes the bit lines coupled to the drain regions of the non-selected memory cell transistors to be applied with zero volts. The drain power supply 10 includes drain voltage generation and regulation circuits 16 for generating the regulated positive potential. A more detailed block diagram of the drain voltage generation and regulation circuits 16 of FIG. 1 is illustrated in FIG. 2.

As can be seen in FIG. 2, the drain voltage generation and regulation circuits 16 are formed of a staggered phase or clock generator 18, a drain charge pump circuit 20, and a voltage programming regulator circuit 22. The charge pump circuit 20 is comprised of eight small pump sections 20a, 20b-20g, and 20h which are connected in parallel, for generating a moderately high level positive voltage DPUMP at pumped up node 24. The charge pump circuit 20 is formed with the eight smaller single-stage pump sections rather than a multiple stage pump. The eight pump sections 20a-20h are driven by staggered clock signals generated by the clock generator so as to provide noise reduction on the VCC and VSS power supply lines. Further, only two of the pump sections are switched at any one given time, one of which is switched on and the other one is switched off, so as to produce additional noise reduction. Since staggered clock signals are being used, there will be less perturbation caused by the dumping of charges into the node 24 by each pump section, thereby reducing ripple.

In order to increase the pump efficiency, it will be noted that each of the pump sections includes a first cancellation circuit 26 for effectively canceling out the threshold drop $V_{tp}$ in the pass transistor T1 and a second cancellation circuit 28 for effectively canceling out the threshold drop $V_{tp}$ in the pass transistor T2. In the lower left side of FIG. 2, there are shown exemplary waveforms Pn, Qn, and Rn which drive the respective input node, the gate of the pass transistor T1, and the gate of the pass transistor T2 in the pump sections. The voltage programming regulator circuit 22 is a series-type regulator which includes a differential comparator 30 for generating the regulated positive potential VPROG at an output node 32.

In FIG. 3, there is shown a more detailed schematic diagram of the blocks 18, 20 and 22 of FIG. 2. The staggered clock generator 18 includes a driver section 18a and a delay section 18b. The driver section includes a NAND logic gate G1 and an inverter gate G2. The logic gate G1 receives on its inputs a 20 MHz clock signal OSC, a program mode signal PGM, and an enable polling signal ENPOLL. The output of the logic gate G1 on line 34 is fed to the input of the inverter gate G2. The output of the inverter gate G2 provides the first clock phase signal Pφ.

The delay section 18b is comprised of inverter gates G3-G6 and delay elements G7-G9. The inverter gate G3 has its input connected to the output of the inverter gate G2 for receiving the first clock phase signal Pφ on line 36 and generates a second clock phase signal P1 on its output (line 38). The delay element G7 has its input connected to the output of the inverter gate G3 and its output (line 40) defining a third clock phase signal P2 connected to the input of the inverter gate G4. The delay element G8 has its input connected to the output (line 42) of the inverter gate G4 defining a fourth clock phase signal P3 and its output (line 44) defining a fifth clock phase signal P4 connected to the input of the inverter gate G5. The delay element G9 has its input connected to the output (line 46) of the inverter gate G5 defining a sixth clock phase signal P5 and its output (line 48) defining a seventh clock phase signal P6 connected to the input of the inverter gate G6. The output (line 50) of the inverter gate G6 provides an eighth clock phase signal P7.

The waveforms of the staggered clock phase signal Pφ through P7 are illustrated in FIGS. 4(a)-4(h). It will be noted that the delay element G7 causes the clock phase signal P1 to be delayed and inverted so as to produce the delayed clock phase signal P2. Similarly, the delay element G8 causes the delayed clock phase signal P3 to be delayed and inverted so as to produce the delayed clock phase signal P4. Finally, the delay element G9 causes the delayed clock phase signal P5 to be delayed and inverted so as to produce the delayed clock phase signal P6.

The pump section 20a has its input connected to line 36 for receiving the first clock phase signal Pφ, and the pump section 20b has its input connected to the line 38 for receiving the second clock phase signal P1. Similarly, the pump sections 20c-20h have their inputs connected to respective lines 40, 42, 44, 46, 48, 50 for receiving the corresponding third through eighth clock phase signals P2 through P7. The outputs of the pump sections 20a-20h on respective lines 52-66 are connected to the pumped up node 24 so as to provide the moderately high level positive voltage DPUMP.

The voltage programming regulator circuit 22 receives as its inputs the clock signal OSC on line 68, a control signal APDB on line 70, a test signal VTB on line 72, the enable polling signal ENPOLL on line 74, the program mode signal PGM on line 76, the high level positive voltage DPUMP on a node 77 via line 78, and a reference potential VREF on line 80. The regulator circuit 22 generates the regulated positive (drain) potential VPROG at the output node 32. The transistor N301 is used to discharge the positive potential VPROG after programming.

Referring back to FIG. 2, the signal INITIALIZE is applied, prior to the programming mode, so as to allow the reference voltage VREF of approximately +2.0 volts to charge up the capacitor Cn. Further, the capacitor Cp is charged initially to the ground potential (zero volts). During the programming mode, the differential comparator 30 is used to compare the voltage VCDV at node 82 with the reference voltage VREF at node 84. When the voltage VCDV is larger than the voltage VREF, the output voltage VOUT of the comparator is varied increasingly which renders less conductive the P-channel pull-up transistor 86, thereby reducing the voltage DPUMP from the output node 32. On the other hand, when the voltage VCDV is smaller than the reference voltage VREF, the output voltage VOUT will be varied decreasingly which renders more conductive the transistor 86, thereby pulling up or increasing the output node to the high positive voltage DPUMP.

Figure 5:
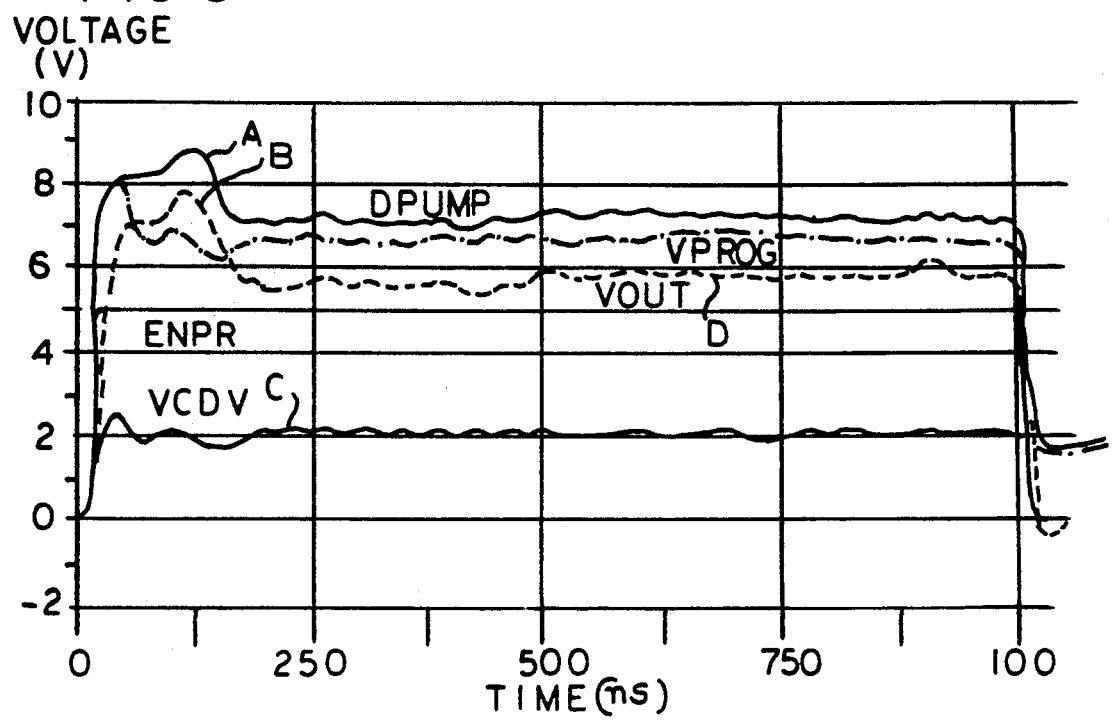
FIG. 5 is a timing diagram indicating the state of various signals in FIGS. 2 and 3, useful in understanding the operation of the present invention.
Figure 9:
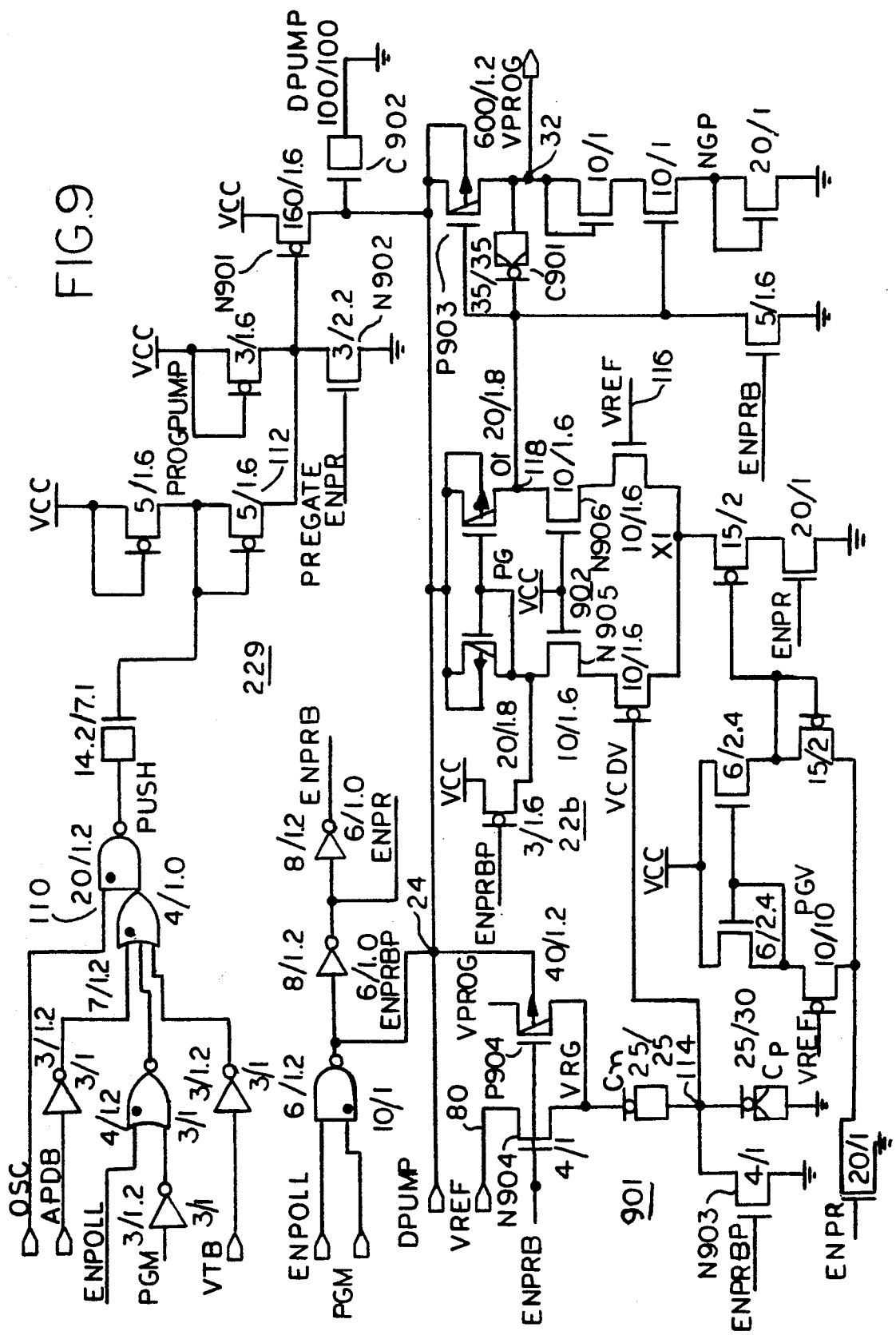
FIG. 9 is a schematic diagram of the voltage programming regulator circuit of FIG. 3.

Referring now to FIG. 5, there are shown the output waveforms of the high level positive voltage DPUMP (curve A) at the pumped up node 24 and the regulated positive voltage VPROG (curve B) at the output node 32 in FIGS. 2 and 3. The differential comparator 30 compares the voltage VCDV (curve C) at the node 82 with the reference voltage VREF. In response to the comparison, the output voltage VOUT (curve D) is generated at the output of the comparator. The voltage VOUT is the control voltage at the node 118 (FIG. 9) which is used to vary the gate voltage of the pass transistor P903 (86 in FIG. 2). In this manner, the regulated positive voltage VPROG will be produced by the variations of the control voltage.

Figure 7:
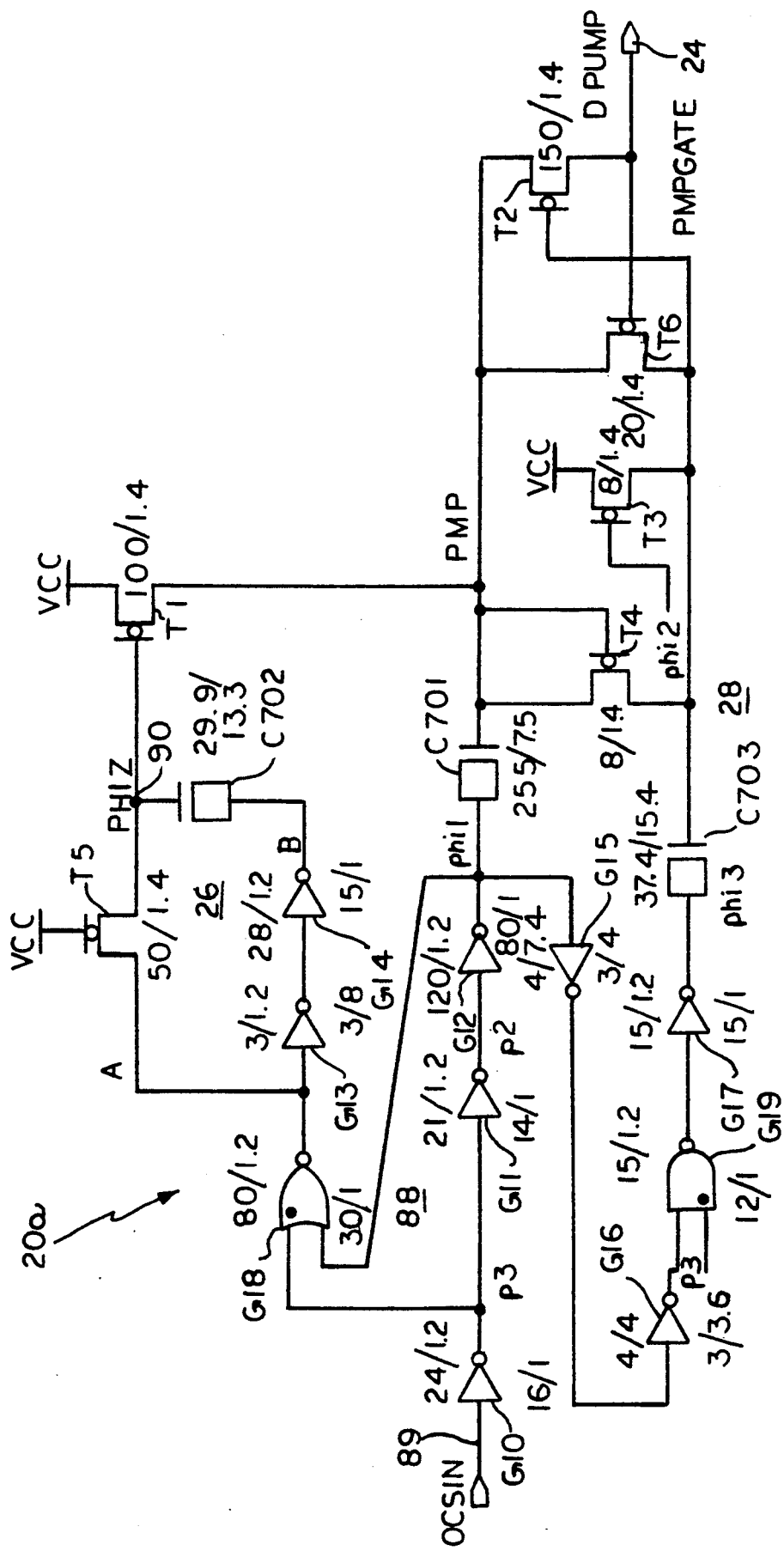
FIG. 7 is a detailed schematic circuit diagram of one of the charge pump sections of FIG. 3.

Since each of the eight pump sections 20a-20h in FIGS. 2 and 3 are identical in their construction and operation, it will be sufficient to describe in detail only one of the pump sections. Therefore, a detailed schematic circuit diagram of the pump section 20a is depicted in FIG. 7. The pump section 20a includes a pump clock driver 88 formed of inverter gates G10-G17, a NOR logic gate G18, and a NAND logic gate G19. The clock driver 88 receives the clock phase signal Pφ from the driver section 18a on line 89 and produces in response the high positive voltage DPUMP on the line 52 as well as the internal clock phases PHI1, PHI2 and PHI3. The pump section 20a also includes the pass transistors T1, T2; a pump capacitor C701; the first cancellation circuit 26; the second cancellation circuit 28; a back charge prevention transistor T3; and a booster diode-connected transistor T4.

The first cancellation circuit 26 is formed by an initialization transistor T5 and a coupling capacitor C702 to provide cancellation of the threshold drop $V_{tp}$ across the pass transistor T1. The second cancellation circuit 28 is formed by an initialization transistor T6 and a coupling capacitor C703 to provide cancellation of the threshold voltage drop $V_{tp}$ across the pass transistor T2. The internal phase clocks PHI2, PHI1, and PHI3 are connected to one side of the respective capacitors C702, C701, and C703. The other side of the coupling capacitor C702 is connected to the gate of the pass transistor T1 at node 90. The other side of the pump capacitor C701 is connected to the node pump, and the other side of the coupling capacitor C703 is connected to the gate of the pass transistor T2.

Figure 6:
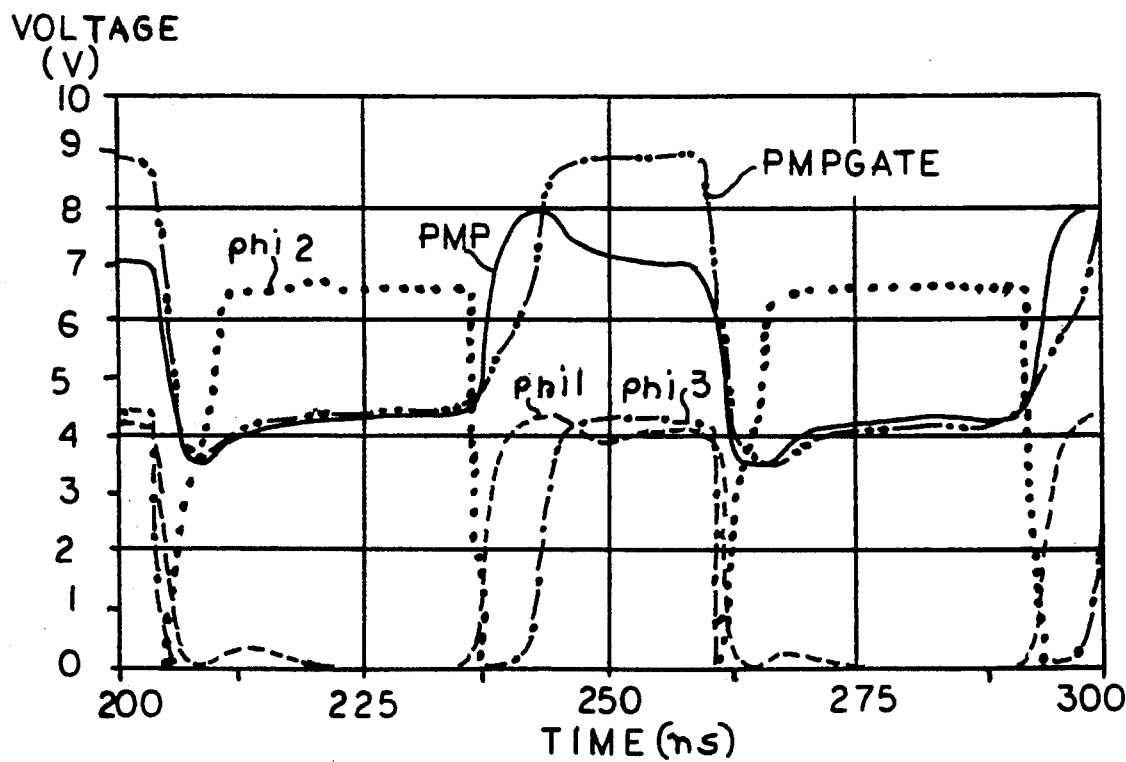
FIG. 6 is a timing diagram indicating the state of various signals at certain internal nodes of a charge pump section in FIGS. 7.

The operation of the pump section 20a depicted in FIG. 7 will now be described with reference to the waveforms in FIG. 6. Initially, it is assumed that the node 90 has been pre-charged by the initialization transistor T5 to approximately +4 volts at time t1. Thus, when the node B goes high the potential at the node 90 will also be raised at time t2. This will also cause the node pmp also to be pre-charged to the supply potential VCC without the loss of a threshold drop across the pass transistor T1. Then, the pass transistor T1 will be turned off before the time t3 when the internal clock phase PHI1 goes high so as to prevent back charging. It will be noted that the back charge prevention transistor T3 is also used to pre-charge the node pmpgate and is used to discharge the same to the supply potential VCC between cycles so as to prevent back charging. The initialization transistor T6 is also used to pre-charge the node pmpgate.

When the internal clock phase PHI1 goes high at the time t3, the node pmp is raised to approximately +8 volts. Next, when the internal clock phase PHI3 goes high at time t4, the node pmpgate will also be raised so as to turn on the pass transistor T2, thereby passing the voltage at the node pmp to the node 24 (DPUMP) without the loss of a threshold drop. The booster diode-connected transistor T4 serves to provide additional pre-charge to the node pmpgate. This additional pre-charge is required since the node 24 (DPUMP) may be heavily loaded and thus may not pre-charge the node pmpgate to an adequate level. Due to the pre-charging at time t3, this allows the voltage on the node pmpgate to be kicked up higher at the time t4.

Since the pump section 20b is driven by the second clock phase signal P1, which is an inverted version of the signal Pφ, the pump section 20b will be turned off while the pump section 20a is being turned on. Similarly, the other pump sections 20d, 20f and 20h will be turned off while the corresponding pump sections 20c, 20e, and 20g are being turned on. By delaying the clock signals to each of the successive pump section, there will always be one pump section delivering current to the pumped up node 24 so as to reduce the ripple effect.

Since each of the delay elements G7 through G9 are identical in their construction and operation, it is sufficient to describe in detail only one of the delay elements. Therefore, a detailed schematic circuit diagram of the delay element G7 is illustrated in FIG. 8. The delay element G7 includes a RC delay circuit 92 and a Schmitt trigger circuit 94. The RC delay circuit consists of an inverter 96, a resistor 98, and a capacitor 100. The input of the inverter 96 defines the input of the delay element G7. The junction of the resistor 98 and the capacitor 100 provides a delayed and inverted signal from the input signal on line 102. The Schmitt trigger circuit includes P-channel transistors P801, P802 and P803; N-channel transistors N801, N802 and N803; an inverter 104; and source degeneration resistors 106, 108. The input of the Schmitt trigger circuit defined by the gates of the transistors P801 and N801 receives the delayed and inverted signal. The output of the schmitt trigger circuit is defined by the output of the inverter 104.

The trip point at node L1 is determined by the ratio of the transistor N803 to the series combination of the transistors N802 and the resistor 108. The trip point at node U1 is determined by the ratio of the transistor P803 to the series combination of the transistors P802 and the resistor 106. Since the resistors 106 and 108 have a positive temperature coefficient which is smaller relative to the temperature coefficient of the transistors P802 and N802, the resistor serves to provide VCC and temperature compensation for the Schmitt trigger circuit.

The voltage programming regulator circuit 22 of FIG. 3 consists of a test level circuit section 22a and a programming regulation section 22b. The test level circuit section 22a includes a clock driver section 110 and a charge pump section 112 driven by the driver section. During the test mode, the node prggate will be pumped up to approximately +8 volts by the high frequency clock signal OSC. As a result, the pull-up transistor N901 will be turned on so as to pull the node 24 (DPUMP) to the power supply potential VCC. When the enable signal ENPR is high (i.e., during the programming mode), the node prggate will be pulled to the ground potential via the transistor N902.

The programming regulation section 22b is used to provide the regulated (drain) positive potential VPROG at the output node 32 during programming. The regulation section 22b consists of a reference voltage VREF, a pre-charge circuit 901, a differential comparator 902, a series pass P-channel transistor P903, and a capacitor C901. The reference voltage is applied on the line 80 and is at approximately +2 volts. The pre-charge circuit 901 includes pre-charge transistors N903, N904; an N-well type capacitor Cp; a MOS capacitor Cn; and a sensing transistor P904. Prior to entering the programming mode, the signal ENPRB and ENPRBP will be made high initially so as to pre-charge the node VRG to about +2 volts and to pre-charge the node 114 to the ground potential. Then, the signal ENPRB and ENPRBP will made low so as to isolate the reference voltage. As can be seen, the capacitor Cn is connected between the nodes VRG and 114, and the capacitor Cp is connected between the node 114 and the ground potential. Since the sensing transistor P904 will be turned on during programming, the voltage VPROG will be divided down by the capacitive divider formed by the capacitors Cn and Cp so as to provide a smaller voltage VCDV at the node 114. The reference voltage is also applied to the line 116.

In operation, the differential comparator 902 compares the voltage at the node 114 (VCDV), which is proportional to the regulated positive potential VPROG, to the reference voltage VREF on the line 116 and generates a control gate voltage on its output at node 118. This gate voltage is then connected to the gate of the series pass transistor P903. If the voltage at the node 114 (VCDV) is higher than the reference voltage VREF on the line 116, the gate voltage will be varied increasingly so as to render the transistor P903 to be less conductive, thereby applying less of the high positive voltage DPUMP to the output node 32 (VPROG). On the other hand, if the voltage at the node 114 is smaller than the reference voltage on the line 116, the gate voltage will be varied decreasingly so as to render the transistor P904 to be more conductive, thereby supplying more of the voltage DPUMP to the output node 32. In this manner, the differential comparator provides the regulated positive potential VPROG at the output node 32.

It will be noted that the differential comparator 902 includes two N-channel transistors N905 and N906 whose gates are connected to the power supply potential VCC for hot-switching protection. The capacitor C901 is connected between the node 118 and the node 32 (VPROG) so as to provide compensation. Further, the capacitor C902 is connected between the pumped up node 24 (VPUMP) and the ground potential so as to reduce any ripple in the output of the charge pump circuit 20.

Figure 10:
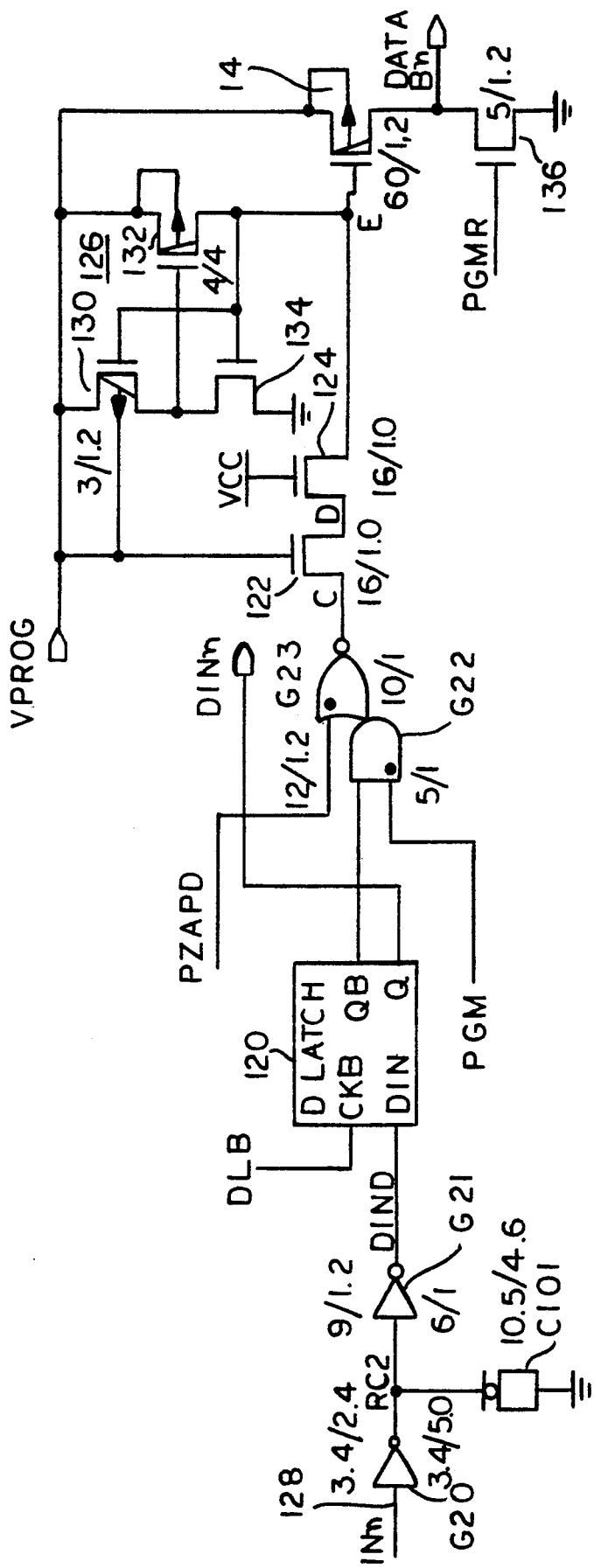
FIG. 10 is a more detailed schematic diagram of the data input buffer circuit of FIG. 1.

Referring now to FIG. 10, there is shown a circuit diagram of the data input buffer circuit 12 of FIG. 1. The data buffer circuit permits the data bit lines coupled to the drain regions of selected memory cell transistors to be supplied with the regulated positive potential VPROG during programming. The data buffer circuit also causes the data bit lines coupled to the drain regions of non-selected memory cell transistors to be supplied with zero volts. The buffer circuit includes inverter gates G20, G21; a capacitor C101; a D-latch circuit 120; an AND logic gate G22; a NOR logic gate G23; two N-channel pass transistors 122, 124; and a level-shifting circuit 126. The data input signal INn is applied to line 128 and is delayed to the data terminal DIN of the D-latch circuit 120 by the inverters G20, G21 and the capacitor C101 When the clock signal DLB on terminal CKB is at a high level, the data signal on the terminal DIN will be passed through to the output terminal QB. When the clock signal DLB goes low, the data is latched on the output terminal QB. The level-shifting circuit 126 is formed of P-channel transistors 130, 132 and an N-channel transistor 134.

During the programming mode, the signal PGM will be high so as to enable the output terminal QB. Since the data signal INn will be at a low level (QB=1) for the selected memory cells, the output of the NOR gate G23 will be low. This low is in turn passed through the transistors 122, 124 and is applied to the gate of the pull-up transistor 14, thereby turning on the same. As a result, the regulated positive potential VPROG on the output node 32 is passed to the data bit lines DATABn. On the other hand, the data signal INn will be at a high level (QB=0) for the non-selected memory cells. Thus, the output of the NOR gate G23 will be high. This high is again passed through the transistors 122, 124 and is applied to the gate of the transistor 14, thereby turning off the same. As a consequence, zero volts will be applied to the data bit lines.

It will be noted that the pass transistor 122 has its gate connected to the regulated positive voltage VPROG and the pass transistor 124 has its gate connected to the power supply potential VCC so as to form a latch-up protection circuit. If the voltage VPROG either drops below the power supply voltage VCC or is increased above the power supply potential VCC, the two transistors 122, 124 will prevent forward biasing of the junctions on either side of the pass transistors. A discharge transistor 136 is used to discharge the data bit lines DATABn during the program reset mode.

In FIG. 11, there is shown a circuit diagram of the D-latch circuit 120 of FIG. 10. The D-latch circuit includes an N-channel pass transistor 138 and inverter gates G24, G25, and G26. The pass transistor 138 has one of its conduction path electrodes connected to the input terminal DIN for receiving the delayed data signal and its other one of the conduction path electrodes connected to a node 140. The gate of the transistor 138 is connected to the terminal CKB for receiving the clock signal DLB. The inverter G24 has its input connected to the node 140 and its output connected to a node 142 and to the input of the inverter G25. The output of the inverter G25 is also connected to the node 140. The node 142 is also connected to the input of the inverter G26 and to the output terminal QB defining an output of the D-latch circuit. The output of the inverter G26 is connected to another output terminal Q.

From the foregoing detailed description, it can thus be seen that the present invention provides an improved drain power supply for generating and supplying a regulated positive potential to drain regions of selected memory cells via bit lines in an array of flash EEPROM memory cells during programming. The drain power supply includes a charge pump circuit formed of a plurality of charge pump sections each being driven by one of a plurality of staggered clock signals for generating a moderately high level positive voltage. A cancellation circuit is coupled to each of the plurality of charge pump sections for effectively canceling out threshold voltage drops in the charge pump circuit. Further, a regulator circuit is provided for generating a control voltage which is varied increasingly so as to reduce the high level positive voltage on an output node and which is varied decreasingly so as to increase the high level positive voltage to the output node.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A drain power supply for generating and supplying a regulated positive potential to drain regions of selected memory cells via bit lines in an array of flash EEPROM memory cells during programming, said drain power supply comprising:

clock means (18) for generating a plurality of staggered clock signals;

charge pump means (20) responsive to an external power supply potential (VCC) and to said plurality of staggered clock signals for generating a moderately high level positive voltage;

said charge pump means being formed of a plurality of charge pump sections (20a-20h), each of said plurality of charge pump sections having its input connected to receive a respective one of said plurality of staggered clock signals and its output connected to a pumped up node;

cancellation means (26, 28) coupled to each of said plurality of charge pump sections for effectively canceling out threshold voltage drops in said plurality of charge pump sections; and regulation means (22) responsive to said regulated positive potential at an output node and a reference voltage for generating a control voltage which is varied increasingly so as to reduce the high level positive voltage to the output node and which is varied decreasingly so as to increase the high level positive voltage to the output node.

2. A drain power supply as claimed in claim 1, wherein said regulated positive potential is approximately +6.5 volts.

3. A drain power supply as claimed in claim 1, wherein each of said plurality of charge pump sections is comprised of a first N-channel pass transistor (T1), a pump capacitor (C701), and a second N-channel pass transistor (T2), said first transistor having its drain connected to the power supply potential (VCC) and its source connected to a pre-charge node, said pump capacitor having its one side connected to the pre-charge node and its other side connected to receive a first internal clock phase, said second transistor having its drain connected to the pre-charge node and its source connected to an output node, the gate of said first transistor being connected to a first internal node, the gate of said second transistor being connected to a second internal node.

4. A drain power supply as claimed in claim 3, wherein said cancellation means is comprised of a first N-channel initialization transistor (T5) and a first coupling capacitor (C702) coupled to the first internal node, and a second N-channel initialization transistor (T6) and a second coupling capacitor (C703) coupled to the second internal node.

5. A drain power supply as claimed in claim 1, wherein said regulation means is comprised of a differential comparator (902) having a non-inverting input, an inverting input, an output, and a series pass P-channel transistor (P903), said differential comparator having its non-inverting input coupled to the reference voltage, its inverting input coupled to said regulated positive potential, and its output coupled to the gate of said series pass transistor, said series pass transistor having its source connected to said high level positive voltage and its drain connected to the output node to provide said regulated positive potential.

6. A drain power supply as claimed in claim 1, wherein said regulation means includes test level means (22a) for pulling said pumped up node to the power supply potential during a test mode of operation.

7. A drain power supply as claimed in claim 1, wherein said clock means is comprised of driver means (18a) responsive to a high frequency clock signal for generating a clock phase signal and delay means (18b) responsive to said clock phase signal for generating said plurality of staggered clock signals in which each is delayed relative to the previous one.

8. A drain power supply as claimed in claim 7, wherein said delay means is comprised of a plurality of inverters (G3–G6) and delay elements (G7–G9), each of said plurality of delay elements including a RC delay circuit (92) and a Schmitt trigger circuit (94), said RC circuit having its input connected to an input signal and an output, said Schmitt trigger having its input connected to the output of said RC delay circuit and its output providing an output signal which is inverted and delayed with respect to said input signal.

9. A drain power supply as claimed in claim 3, wherein each of said plurality of charge pump sections further includes a back charging transistor (T3) coupled between said power supply potential (VCC) and said second internal node and a booster diode-connected transistor (T4) coupled between said pre-charge node and said second internal node.

10. In an array of flash EEPROM memory cells formed on a substrate to define columns and rows, where the substrate includes a common source line extending along at least one of the rows, a plurality of bit lines extending along respective columns, where each memory cell includes an N-type source region, coupled to the common source line, a control gate, a floating gate, a channel region and an N-type drain region coupled to a respective one of the bit lines, wherein each memory cell is programmable predominately by transferring hot electrons into its floating gate, and a drain power supply for generating and supplying a regulated positive potential to drain regions of selected memory cells via the bit lines during programming, said drain power supply comprising:

clock means (18) for generating a plurality of staggered clock signals;

charge pump means (20) responsive to an external power supply potential (VCC) and to said plurality of staggered clock signals for generating a moderately high level positive voltage;

said charge pump means being formed of a plurality of charge pump sections (20a–20h), each of said plurality of charge pump sections having its input connected to receive a respective one of said plurality of staggered clock signals and its output connected to a pumped up node;

cancellation means (26, 28) coupled to each of said plurality of charge pump sections for effectively canceling out threshold voltage drops in said plurality of charge pump sections; and regulation means (22) responsive to said regulated positive potential at an output node and a reference voltage for generating a control voltage which is varied increasingly so as to reduce the high level positive voltage to the output node and which is varied decreasingly so as to increase the high level positive voltage to the output node.

11. In an array of flash EEPROM memory cells as claimed in claim 10, wherein said regulated positive potential is approximately 6.5 volts.

12. In an array of flash EEPROM memory cells as claimed in claim 10, wherein each of said plurality of charge pump sections is comprised of a first N-channel pass transistor (T1), a pump capacitor (C701), and a second N-channel pass transistor (T2), said first transistor having its drain connected to the power supply potential (VCC) and its source connected to a pre-charge node, said pump capacitor having its one side connected to the pre-charge node and its other side connected to receive a first internal clock phase, said second transistor having its drain connected to the pre-charge node and its source connected to an output node, the gate of said first transistor being connected to a first internal node, the gate of said second transistor being connected to a second internal node.

13. In an array of flash EEPROM memory cells as claimed in claim 12, wherein said cancellation means is comprised of a first N-channel initialization transistor (T5) and a first coupling capacitor (C702) coupled to the first internal node, and a second N-channel initialization transistor (T6) and a second coupling capacitor (C703) coupled to the second internal node.

14. In an array of flash EEPROM memory cells as claimed in claim 10, wherein said regulation means is comprised of a differential comparator (902) having a non-inverting input, an inverting input, an output, and a series pass P-channel transistor (P903), said differential comparator having its non-inverting input coupled to the reference voltage, its inverting input coupled to said regulated positive potential, and its output coupled to the gate of said series pass transistor, said series pass transistor having its source connected to said high level positive voltage and its drain connected to the output node to provide said regulated positive potential.

15. In an array of flash EEPROM memory cells as claimed in claim 10, wherein said regulation means includes test level means (22) for pulling said pumped up node to the power supply potential during a test mode of operation.

16. In an array of flash EEPROM memory cells as claimed in claim 10, wherein said clock means is comprised of driver means (18a) responsive to a high frequency clock signal for generating a clock phase signal and delay means (18b) responsive to said clock phase signal for generating said plurality of staggered clock signals in which each is delayed relative to the previous one.

17. In an array of flash EEPROM memory cells as claimed in claim 16, wherein said delay means is comprised of a plurality of inverters (G3–G6) and delay elements (G7–G9), each of said plurality of delay elements including a RC delay circuit (92) and a Schmitt trigger circuit (94), said RC circuit having its input connected to an input signal and an output, said Schmitt trigger having its input connected to the output of said RC delay circuit and its output providing an output signal which is inverted and delayed with respect to said input signal.

18. In an array of flash EEPROM memory cells as claimed in claim 12, wherein each of said plurality of charge pump sections further includes a back charging transistor (T3) coupled between said power supply potential (VCC) and said second internal node and a booster diode-connected transistor (T4) coupled between said pre-charge node and said second internal node.

19. A drain power supply for generating and supplying a regulated positive potential to drain regions of selected memory cells via bit lines in an array of flash EEPROM memory cells during programming, said drain power supply comprising:

charge pump means (20) responsive to an external power supply potential (VCC) and to a plurality of staggered clock signals for generating a moderately high level positive voltage;

cancellation means (26, 28) coupled to said charge pump means for effectively canceling out threshold voltage drops in said charge pump means; and regulation means (22) responsive to said regulated positive potential at an output node and a reference voltage for generating a control voltage which is varied increasingly so as to reduce the high level positive voltage to the output node and which is varied decreasingly so as to increase the high level positive voltage to the output node.

* * * * *